United States Patent [19]

Bonu

[11] 4,412,504
[45] Nov. 1, 1983

[54] DEVICE FOR HOLDING SUBSTRATE WAFERS

[75] Inventor: Bonu Bonu, Munich, Fed. Rep. of Germany

[73] Assignee: Siemens Aktiengesellschaft, Berlin and Munich, Fed. Rep. of Germany

[21] Appl. No.: 282,716

[22] Filed: Jul. 13, 1981

[30] Foreign Application Priority Data

Jul. 28, 1980 [DE] Fed. Rep. of Germany ....... 3028536

[51] Int. Cl.³ ...................... B05C 11/14; B05C 13/00
[52] U.S. Cl. .................................. 118/664; 118/500; 118/730
[58] Field of Search ............... 118/500, 503, 504, 505, 118/721, 720, 728, 729, 730, 664

[56] References Cited

U.S. PATENT DOCUMENTS

| 3,023,727 | 3/1962 | Theodoseau et al. | 118/721 X |
| 3,643,625 | 2/1972 | Mahl | 118/500 X |
| 3,699,917 | 10/1972 | Deverse | 118/730 |
| 3,768,440 | 10/1973 | Doman et al. | 118/503 X |
| 4,010,710 | 3/1977 | Williams | 118/503 X |

Primary Examiner—Shrive P. Beck
Attorney, Agent, or Firm—Herbert L. Lerner; Laurence A. Greenberg

[57] ABSTRACT

Device for holding substrate wafers, especially semiconductor wafers, including a plurality of rings having disposed thereon at least one bearing surface, respectively, extending toward the interior of the respective ring, and means for yieldingly pressing the substrate wafers against the respective bearing surfaces.

17 Claims, 11 Drawing Figures

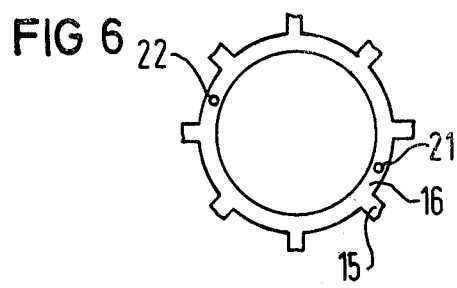
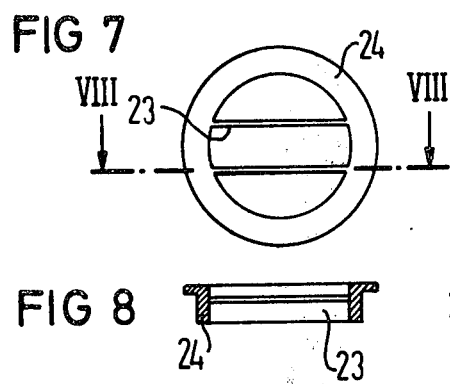
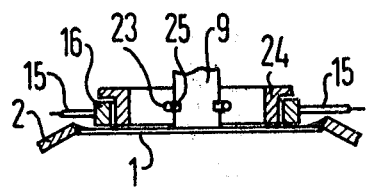
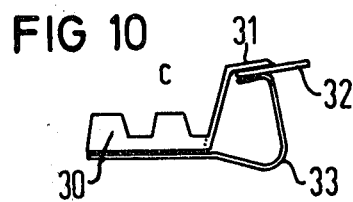
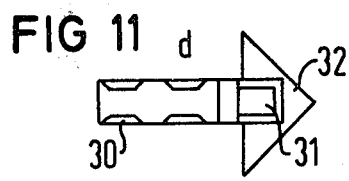

DEVICE FOR HOLDING SUBSTRATE WAFERS

The invention relates to a device for holding substrate wafers, especially circular semiconductor wafers.

In the production of metal, oxide and similar coatings applied to substrate wafers, for example, by vapor-deposition or sputtering processes, devices for holding such circular substrate wafers are needed to permit the coating to be applied as evenly as possible. For electron-beam vapor-deposition equipment employed for the metallization of semiconductor wafers, a substrate carrier formed of a number of metal discs welded in juxtaposition has become known heretofore from Airco-Temescal, Vacuum Systems, Components & Technical Literature, Issue I, 1972/73, pages 111 to 116. Attached to each metal disc is a movable metal clip to fix the semiconductor wafer. It has furthermore been known heretofore to provide the metal discs with a spring and two small stop brackets so that, after the insertion of the semiconductor wafers into the substrate carrier, the spring will press them against the stop brackets and thus fix them. Such substrate carriers are generally arranged in a hemispherical vessel and in order to obtain uniform vapor deposition, are moved so as to turn about their own axis, on the one hand, and about an axis of the hemisphere of the vessel, on the other hand. Such substrate carriers are, therefore, also referred to as planets.

It is has been found that loading a substrate carrier, heretofore known from the state of the art, with semiconductor wafers, especially thin wafers, is not without problems. For example, breakage can sometimes occur when inserting the wafer with pincers. If such substrate carriers are used in hot vapor-deposition processes, the contact of the silicon wafers will be irregular or nonuniform due to unevennesses of metal disc to metal disc, resulting in different temperatures being produced therein during the vapor-deposition process. These temperature differences can be as high as 40° C.

Due to the unstable holding device, the number of rejects also rises considerably during hot vapor-deposition. Thus, silicon wafers will sometimes fall off the substrate carrier, which can lead to electrical short-circuits, especially in the heating equipment, during heating-up. If the wafers should fall off the substrate carriers during the vapor deposition process, the process may be interrupted due to contamination of the vapor source by silicon splinters or as a consequence of short-circuits in the electron beam gun and disturbances in the control system caused thereby. If silicon wafers or silicon splinters should fall into the vapor source, splashes of metal onto the wafers that are to be coated by vapor-deposition may also be produced.

It is accordingly an object of the invention to provide a device for holding or carrying substrate wafers which can be loaded with substrate wafers, especially semiconductor wafers, in a relatively simple manner, holds the substrate wafer reliably and, to a great extent, prevents temperature differences in the substrate wafers during the vapor-deposition process, and otherwise avoids the disadvantages of the heretofore known devices of this general type.

With the foregoing and other objects in view, there is provided, in accordance with the invention a device for holding substrate wafers, especially semiconductor wafers, including a plurality of rings having disposed thereon at least one bearing surface, respectively, extending towards the interior of the respective ring, and means for yieldingly pressing the substrate wafers against the respective bearing surfaces.

In accordance with another feature of the invention, the substrate wafers are circular and the rings are correspondingly circular.

In accordance with a further feature of the invention, the bearing surface is provided on a marginal strip disposed at the inside of the respective rings.

In accordance with an additional feature of the invention, the bearing surface is provided on at least one projection at the inside of the respective rings.

In accordance with an added feature of the invention, the plurality of rings are circular and are disposed concentrically about a middle part.

In accordance with yet another feature of the invention, the middle part is circular.

In accordance with yet a further feature of the invention, the substrate wafers are circular and the rings are correspondingly circular, the circular rings being disposed so as to conform to the surface of a substantially spherical segment.

In accordance with yet an additional feature of the invention, the substrate wafers are circular and the rings are correspondingly circular, the circular rings being disposed so as to be in mutual engagement at least at one point of the periphery thereof.

In accordance with yet an added feature of the invention, the substrate wafers are circular and the rings are correspondingly circular, and including a stabilizing ring surrounding the circular rings.

In accordance with an alternate feature of the invention, the means for yieldingly pressing the substrate wafers against the respective bearing surfaces comprise pressure springs secured to respective holding arms.

In accordance with a still further feature of the invention, the pressure springs are formed so as to engage the respective substrate wafers at two locations.

In accordance with another feature of the invention, the plurality of rings are disposed concentrically about a middle part, and including a hub fastenable to the middle part, the holding arms extending radially outwardly spiderlike from the hub.

In accordance with a further feature of the invention, the device includes a stabilizing ring surrounding the plurality of rings, the holding arms being attached to the stabilizing ring.

In accordance with an additional feature of the invention, the device includes clips for fastening the hub to the middle part.

In accordance with an added feature of the invention, the hub has guide means for ensuring even seating thereof on the middle part.

In accordance with still another feature of the invention, the plurality of rings are disposed concentrically about a middle part, and including a drive shaft disposed on one side of the middle part for engagement with driving means.

In accordance with still a further feature of the invention, the drive shaft is formed with two locking slots.

In accordance with still an additional feature of the invention, the device includes a hub fastenable to the middle part, and a lock ring fixable to the drive shaft for fastening the hub to the middle part.

In accordance with still an added feature of the invention, the lock ring has two spring wires respectively engageable in the locking slots formed on the drive shaft.

In accordance with an alternate feature of the invention, the middle part is formed as a metal disc and has at least three bump-like engagement locations on the side thereof opposite the one side on which the drive shaft is disposed, and including at least two resilient holding clips disposed at the periphery of the metal disc.

In accordance with another feature of the invention, the plurality of rings are disposed about a middle part, and including means for seating a test gage block holder on the middle part.

In accordance with a further feature of the invention, the test gage block holder has a cover plate with at least one beveled edge and a pressure spring for pressing against the cover plate a test gage block receivable in the holder.

In accordance with a concomitant feature of the invention, the rings are disposed so that the respective substrate wafers received therein are exposable for having a coating deposited on at least one surface thereof, respectively.

Other features which are considered as characteristic for the invention are set forth in the appended claims.

Although the invention is illustrated and described herein as embodied in device for holding substrate wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, in which:

FIGS. 6 and 7 are top plan views of parts of a further embodiment of means for applying elastic pressure to the substrate wavers;

FIG. 8 is a cross-sectional view of FIG. 7 taken along the line VIII—VIII in direction of the arrows;

FIG. 9 is a cross-sectional view of the embodiment of FIGS. 6 and 7 shown assembled on the central part of the device; and FIGS. 10 and 11 are side elevational and plan views, respectively, of a test gage block holder suited for measuring the thickness of the layer or coating.

Figure 1:
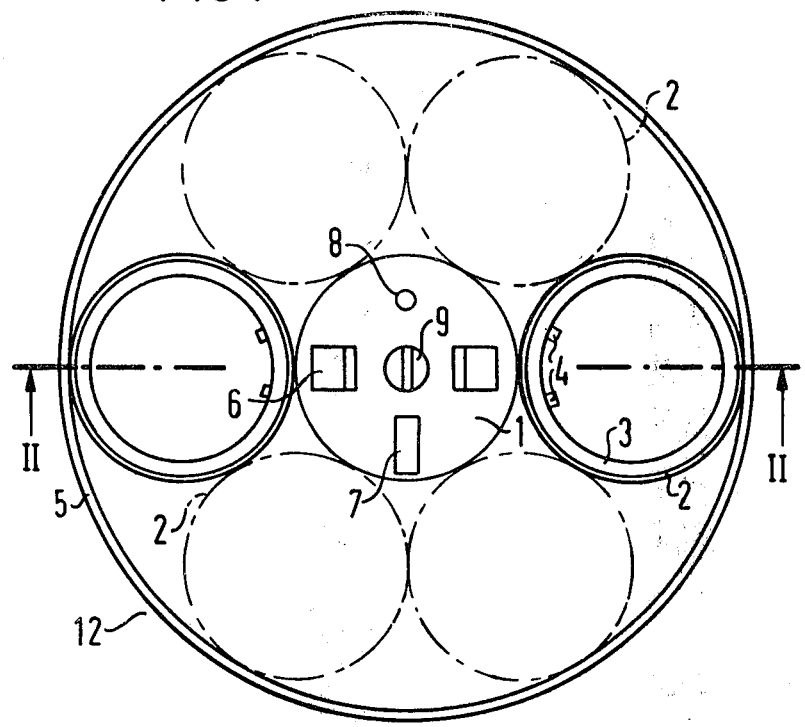
FIG. 1 is a top plan view of an embodiment of a device according to the invention for holding circular substrate wafers.

Referring now to the drawing and first, particularly, to FIG. 1 thereof, there is shown an embodiment of a substrate holder according to the invention formed of six circular rings 2 which are arranged concentrically around a circular central part 1, a marginal or rim strip 3 and two projections 4 extending toward the center of each of the circular rings 2. The rings 2 and the central part 1 are made of metal and interconnected, for example, by welding, at points of contact thereof. The circular rings 2 are enclosed at the outside by a stabilizing ring 5 which is welded thereto.

Pressure or compression springs 6 are disposed on the central part 1 for fastening thereto means for elastically pressing substrate wafers against the bearing or contact surfaces 3 and 4. Also disposed on the central part 1 are a rod 7 to fasten a gage block holder described hereinafter in greater detail, a guide pin 8 and a drive shaft 9 suited for engagement with driving means.

Figure 2:
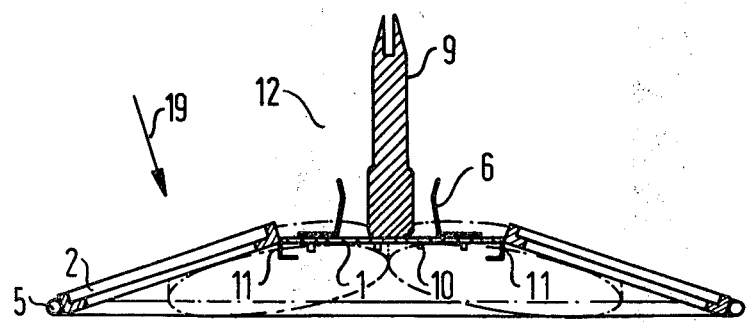
FIG. 2 is a cross-sectional view of FIG. 1 taken along the line II—II in direction of the arrows.

FIG. 2 is a cross-sectional view of the embodiment of the device according to the invention shown in FIG. 1, taken along the line II—II. To seat a further substrate wafer in addition to those which are to be seated in the rings 2, there are disposed on the central part 1, at least three protuberant seating points 10 and at least two spring holding clips 11.

Figure 3:
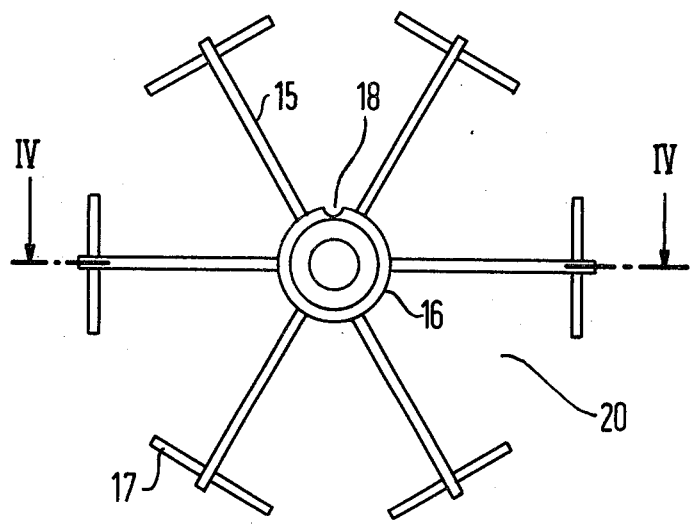
FIG. 3 is a top plan view of means for applying pressure elastically to the substrate wafers.

FIG. 3 shows, in a top plan view, an embodiment of the means 20 for elastically pressing the substrate wafers against the seating surfaces. It is formed of holding arms 15 directed radially outwardly and attached spiderlike to a hub 16 which is fastenable to the central part 1. It is also possible, however, to fasten the holding arms 15 to the stabilizing ring 5. Mounted at the end of the holding arms 15 distant from the hub 16 are pressure springs 17 formed so as to contact the substrate wafers only at two points. When thick substrate wafers are used, if the holding arms 15 themselves are formed suitably spring-elastic or resilient, pressure springs 17 can be dispensed with.

Figure 4:
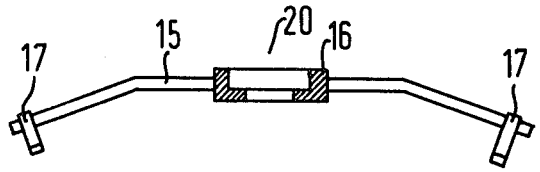
FIG. 4 is a cross-sectional view of FIG. 3 taken along line IV—IV in direction of the arrows.
Figure 5:
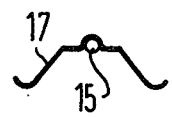
FIG. 5 is a fragmentary enlarged side elevational view of FIG. 4 showing a pressure spring according to the invention.

FIG. 4 is a cross-sectional view of the pressure-applying device 20 of FIG. 3 taken along line IV—IV. In FIG. 5, there is shown one of the pressure springs 17. The hub 16 is formed with a guide slot 18 (FIG. 3) which is engaged by the guide pin 8 when the pressure-applying or holding device 20 is placed upon the substrate holder 12, thereby ensuring the invariable or even seating of the pressure-applying device 20 with respect to the substrate holder 12.

The device according to the invention is operated as follows:

The substrate wafers, for example, 0.4 mm thick silicon wafers, are lifted out of a supply container by means of suction pincers and placed, in direction of the arrow 19, into the rings 2 so as to lie upon the bearing surfaces 3 and 4. Thereafter, the holder or pressure-applying device 20 is slid over the drive shaft 9 onto the substrate holder 12 so that the guide pin 8 engages in the guide slot 18, and the pressure or compression springs 6 snap-in to fasten the holder or pressure-applying device 20. The substrate wafers are consequently pressed against the bearing surfaces 3 and 4 and thereby securely held. In this manner, it is possible to attain uniform pressures when fastening the wafer and to prevent breakage.

In contrast with substrate carriers formed of metal discs heretofore known as state of the art, the substrate carrier according to the invention, having the rings 2 and the area-wise small bearing surfaces 3 and 4, assures a considerably improved temperature constancy of the substrate wafers. The insertion of the substrate wafers into the substrate carrier according to the invention is uncomplicated and rapidly effected. By equipping the center part 1 with bump-like contact points 10 and holding clips 11, point contacting of another inserted substrate wafer is afforded, this disposition of the substrate wafer permitting similar thermal conditions as for the wafers retained in the rings 2.

FIG. 6 illustrates a modification or variant of the means for fastening the retention or pressure-applying means 20 according to the invention. In FIG. 6, the hub 16 is provided with two guide holes 21 and 22 of different size in which corresponding guide pins disposed on the center part 1 are insertable, making a fixation possible.

It is also possible to fasten the hub 16 by means of a lock ring 24 illustrated in FIGS. 7 to 9. FIG. 7 shows the lock ring 24 in a top plan view while FIG. 8 is a cross-sectional view of the lock ring 24 taken along the line VIII—VIII in FIG. 7. FIG. 9 is a fragmentary cross-sectional view of FIG. 1 taken along the line II—II, with the hub 16 fastened by means of the lock ring 24 of FIG. 8.

Formed on the drive shaft 9 are two locking slots 25, in each of which a respective spring wire 23 disposed on the lock ring 24 is engageable. The hub 16 is then fixed by the lock ring 24.

It is thus possible, in a relatively simple manner, to lock or fix the retention or pressure-applying device 20 by rotating the lock ring 24, and to unlock it, respectively.

The substrate holder according to the invention may not only have one ring of circles 2 as shown in FIG. 1, but may also have several. If the "rings" 2 are appropriately constructed, it is also possible, for course, for them to hold substrate wafers other than circular ones. If several circles of rings 2 are provided, correspondingly more holding arms 15 must be provided, or one holding arm 15 must be equipped with several pressure or compression springs 17, or suitable modifications must be made. The rings 2 are advantageously spherically disposed, such as is indicated in FIG. 2, for example.

To measure the vapor-deposited coating thickness, a gage block holder may be used which is locked to the rod 7 fastened to the center part 1 and holds a test gage block 32 formed of the material to be vapor-deposited, such as silicon, for example. As shown in cross-sectional view in FIG. 10 and in top plan view in FIG. 11, the gage block holder 30 is formed of a cover plate 31 and a pressure or compression spring 33 which forces a test gage block 32, for example, of triangular shape, against the cover plate 31. To permit an exact measurement of the vapor-deposited coating thickness, the cover plate 31 is beveled towards the test gage block 32, for example like a sharp knife edge. A vertical edge or ridge of the vapor-deposited coating is thus obtained, permitting a direct mechanical measurement.

Measuring the thickness of the vapor-deposited metal coating is considerably simplified by an appropriately held test gage block, because it is then no longer necessary first to vapor-deposit a test wafer for this purpose, then to varnish it strip-wise, heat it, etch it, remove the varnish and thereafter measure the coating thickness.

There are claimed:

1. Device for holding substrate wafers comprising a plurality of circular rings disposed concentrically about a middle part and having disposed thereon at least one bearing surface, respectively, extending towards the interior of the respective ring, and means for yieldingly pressing the substrate wafers against the respective bearing surfaces, said means for yieldingly pressing the substrate wafers against the respective bearing surfaces comprising pressure springs secured to respective holding arms, said plurality of rings including a hub fastenable to said middle part, said holding arms extending radially outwardly spiderlike from said hub.

2. Device according to claim 1 including a hub fastenable to said middle part, and a lock ring fixable to the drive shaft for fastening said hub to said middle part.

3. Device according to claim 2 wherein said lock ring has two spring wires respectively engageable in said locking slots formed on said drive shaft.

4. Device for holding substrate wafers comprising a plurality of rings having disposed thereon at least one bearing surface, respectively, extending towards the interior of the respective ring, and means for yieldingly pressing the substrate wafers against the respective bearing surfaces, said means for yieldingly pressing the substrate wafers against the respective bearing surfaces comprising pressure springs secured to respective holding arms, said plurality of rings being disposed concentrically about a middle part, and including a hub fastenable to said middle part, said holding arms extending radially outwardly spiderlike from said hub.

5. Device according to claim 4 wherein the substrate wafers are circular and said rings are correspondingly circular.

6. Device according to claim 4 wherein said bearing surface is provided on a marginal strip disposed at the inside of the respective rings.

7. Device according to claim 4 wherein said bearing surface is provided on at least one projection at the inside of the respective rings.

8. Device according to claim 4 wherein said middle part is circular.

9. Device according to claim 4 wherein the substrate wafers are circular and said rings are correspondingly circular, said circular rings being disposed so as to conform to the surface of a substantially spherical segment.

10. Device according to claim 4 wherein the substrate wafers are circular and said rings are correspondingly circular, said circular rings being disposed so as to be in mutual engagement at least at one point of the periphery thereof.

11. Device according to claim 4 wherein said pressure springs are formed so as to engage the respective substrate wafers at two locations.

12. Device according to claim 4 including spring clips for fastening said hub to said middle part.

13. Device according to claim 4 wherein said hub has guide means for ensuring even seating thereof on said middle part.

14. Device according to claim 4, and including means for seating a test gage block holder on said middle part.

15. Device according to claim 12 wherein said test gage block holder has a cover plate with at least one beveled edge and a pressure spring for pressing against said cover plate a test gage block receivable in said holder.

16. Device according to claim 4 wherein said rings are disposed so that the respective substrate wafers received therein are exposable for having a coating deposited on at least one surface thereof, respectively.

17. Device according to claim 4 wherein the substrate wafers are semiconductor wafers.

* * * * *